(12) United States Patent
Nelson (10) Patent No.: US 6,971,742 B2
(45) Date of Patent: Dec. 6, 2005

(54) SLURRIED SUSPENSION EJECTOR AND RELATED SYSTEMS AND METHODS OF FORMING SAME

(75) Inventor: Veronica A. Nelson, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 82 days.

(21) Appl. No.: 10/627,090

(22) Filed: Jul. 24, 2003

(65) Prior Publication Data

US 2005/0018011 A1  Jan. 27, 2005

(51) Int. Cl.$^7$ .............................................. B41J 2/175
(52) U.S. Cl. ...................................................... 347/87
(58) Field of Search ............................. 347/40, 43, 84, 347/85, 86, 87, 95, 112; 427/191, 217

(56) References Cited

U.S. PATENT DOCUMENTS

| | | | |
|---|---|---|---|
| 5,992,990 A | * | 11/1999 | Childers et al. ............... 347/87 |
| 6,268,014 B1 | | 7/2001 | Eberspacher et al. |
| 6,416,156 B1 | * | 7/2002 | Noolandi et al. ............. 347/21 |
| 6,705,699 B2 | * | 3/2004 | Du et al. ....................... 347/40 |

* cited by examiner

*Primary Examiner*—Anh T. N. Vo (57) ABSTRACT

An exemplary printing device and related systems are described. One exemplary printing device includes one or more print cartridges configured to selectively eject generally fluidic material onto a media. At least one print cartridge of the one or more print cartridges is configured to eject a first generally fluidic material comprising a slurried suspension.

13 Claims, 6 Drawing Sheets

SLURRIED SUSPENSION EJECTOR AND RELATED SYSTEMS AND METHODS OF FORMING SAME

BACKGROUND

Photovoltaic or "solar" cells are traditionally manufactured utilizing crystalline semiconductor substrates. Such processes can limit the type of applications where solar cells can be utilized. Advances have been made in slurried solar cell suspensions, but their use has been constrained by a lack of precise application means.

BRIEF DESCRIPTION OF THE DRAWINGS

The drawings described below provide non-limiting examples of suitable embodiments. The same components are used throughout the drawings to reference like features and components wherever feasible.

DETAILED DESCRIPTION

Overview

The embodiments described below pertain to printing devices configured to selectively eject slurried solar cell suspensions ("solar slurry"). In this document the terms "solar cell" and "photovoltaic cell" are used interchangeably. In one embodiment, an ink jet printer is configured to eject the solar slurry. In another embodiment, an ink jet printer is configured to eject ink from a portion of the printer and solar slurry from another portion of the printer. Such configurations create new applications for solar cells on various consumer goods and/or consumer good packaging. In one such application, an exemplary printer can be utilized to form an image on a print media such as a greeting card. The image can include a portion comprised of ink and a portion comprised of solar slurry. The solar slurry can power an electronic device to which it is electrically coupled.

First Exemplary Embodiment

Figure 1:
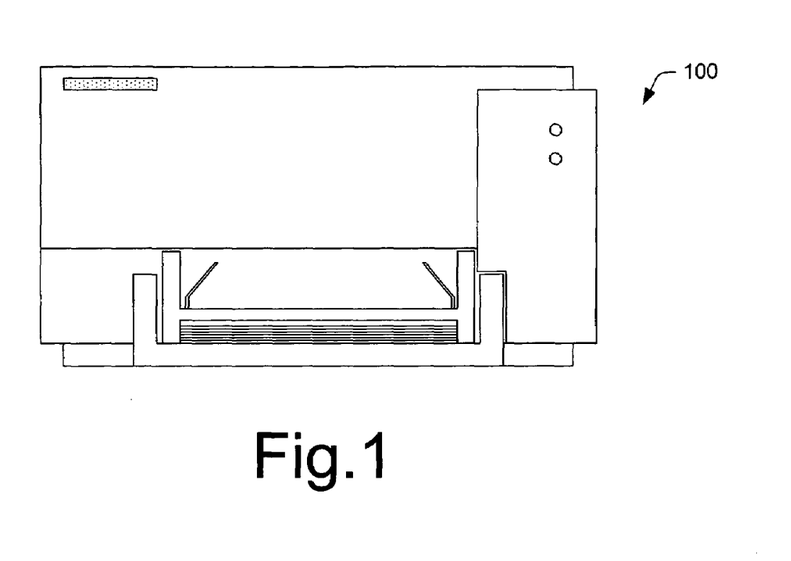
FIG. 1 shows a front elevational view of an exemplary printing device in accordance with one embodiment.

FIG. 1 shows an exemplary printing device. In this embodiment, the printing device comprises a printer 100. The printer shown here is embodied in the form of an inkjet printer. The term "printing device" refers to any type of printing device and/or image forming device configured to selectively eject generally fluidic material, such as ink onto a media. Examples of such printing devices can include, but are not limited to, printers, facsimile machines, and photocopiers.

Figure 2:
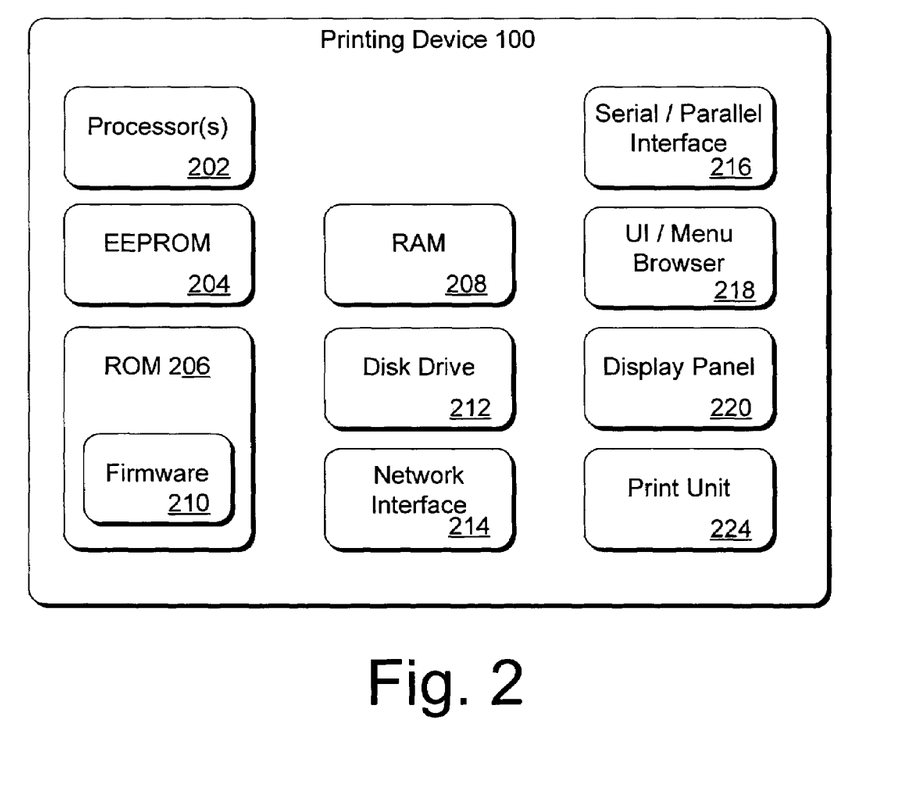
FIG. 2 shows a block diagram of components of an exemplary printing device in accordance with one embodiment.

FIG. 2 illustrates various components of exemplary printing device 100. Printing device 100 may include one or more controllers that are embodied as one or more processors 202 to control various printing operations, such as media handling and fluid ejection.

Printing device 100 may have an electrically erasable programmable read-only memory (EEPROM) 204, ROM 206 (non-erasable), and a random access memory (RAM) 208. Although printing device 100 is illustrated as having an EEPROM 204 and ROM 206, a particular printing device may only include one of the memory components. Additionally, although not shown, a system bus may connect the various components within the printing device 100.

The printing device 100 may also have a firmware component 210 that is implemented as a permanent memory module stored on ROM 206. The firmware 210 is programmed and tested similar to software, and is distributed with the printing device 100. The firmware 210 may be implemented to coordinate operations of the hardware within printing device 100 and contains programming constructs used to implement such operations.

Processor(s) 202 processes various instructions to control the operation of the printing device 100 and to communicate with other electronic and computing devices. The memory components, EEPROM 204, ROM 206, and RAM 208, store various information and/or data such as configuration information, fonts, templates, data being printed, and menu structure information. Although not shown, a particular printing device may also include one or more flash memory devices in place of or in addition to EEPROM 204 and ROM 206.

Printing device 100 may also include a disk drive 212, a network interface 214, and a USB/serial/parallel interface 216. Disk drive 212 provides additional storage for data being printed or other information maintained by the printing device 100. Although printing device 100 is illustrated as having both RAM 208 and a disk drive 212, a particular printing device may include either RAM 208 or disk drive 212, depending on the storage needs of the printer. For example, some printing devices may include a small amount of RAM 208 and no disk drive 212, thereby reducing the manufacturing cost of the printing device.

Network interface 214 provides a connection between printing device 100 and a data communication network. The network interface 214 allows devices coupled to a common data communication network to send print jobs, menu data, and other information to printing device 100 via the network. Similarly, USB/serial/parallel interface 216 provides a data communication path directly between printing device 100 and another electronic or computing device. Although printing device 100 is illustrated as having a network interface 214 and serial/parallel interface 216, a particular printing device may only include one such interface component.

Printing device 100 may also include a user interface and menu browser 218, and a display panel 220. The user interface and menu browser 218 allow a user of the printing device 100 to navigate the printing device's menu structure. User interface 218 may be implemented as indicators or as a series of buttons, switches, or other selectable controls that are manipulated by a user of the printing device. Display panel 220 is a graphical display that provides information regarding the status of the printing device 100 and the current options available to a user through the menu structure.

Printing device 100 also includes a print unit 224 that includes mechanisms arranged to selectively apply generally fluidic material ("fluid"), e.g., liquid ink and/or solar slurry to a media such as paper, plastic, fabric, and the like in accordance with print data corresponding to a print job. The function of print unit 224 can be controlled by a controller such as processor 202, which can execute instructions stored for such purposes. In some embodiments, processor 202 causes print media to be fed through the printer to receive the ink.

Figure 3:
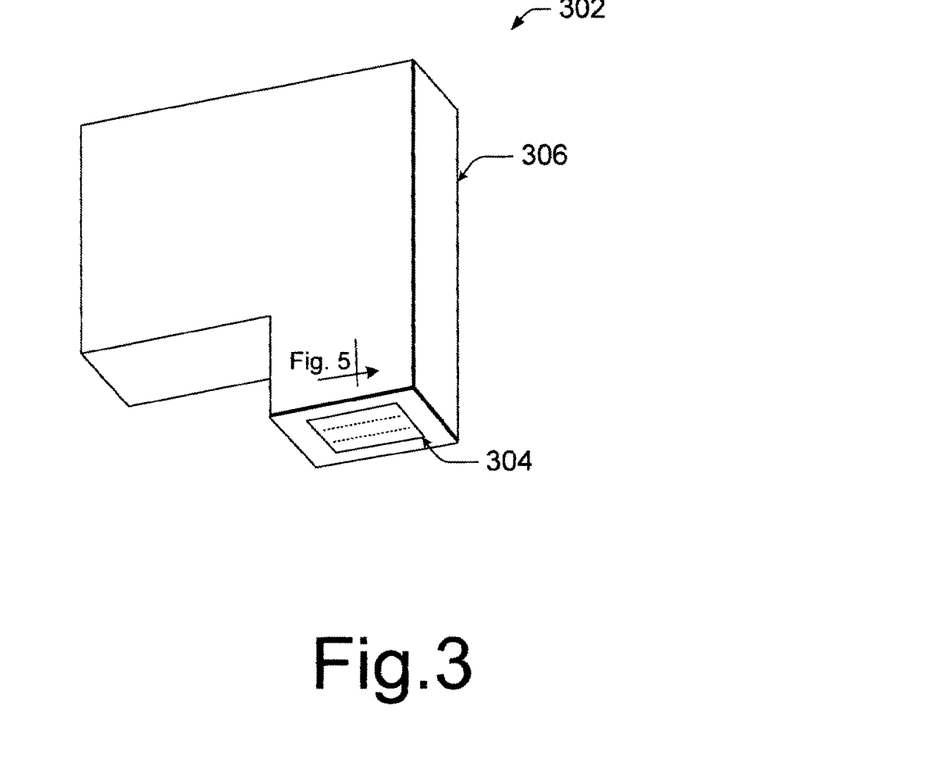
FIG. 3 shows a perspective view of an exemplary print cartridge in accordance with one embodiment.
Figure 4:
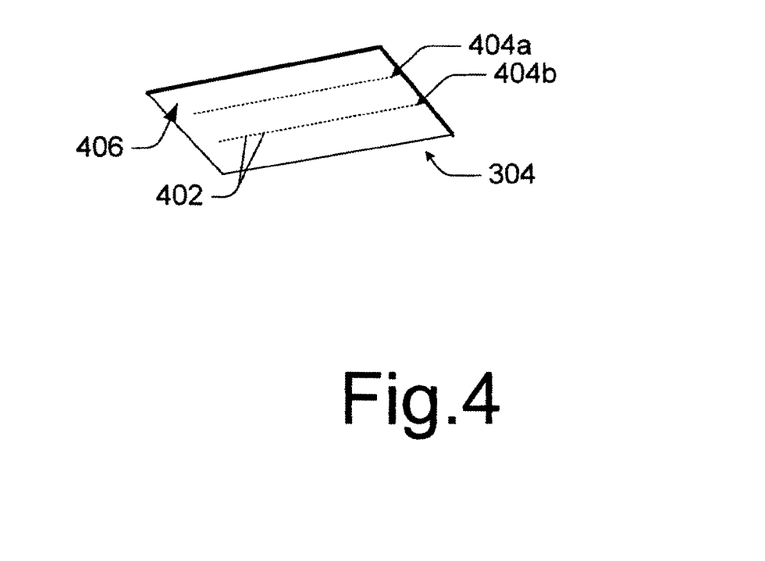
FIG. 4 shows a perspective view of a portion of the print cartridge shown in FIG. 3

FIGS. 3–4 show portions of an exemplary print cartridge 302 for ejecting drops of fluid in a desired pattern. Various suitable materials will be described in detail below. The print cartridge can be utilized in an exemplary printing device such as printer 100. Print cartridge 302 is comprised of a print head 304 and a cartridge body 306.

While a single print head 304 is shown on print cartridge 302, other print cartridges may have multiple print heads on a single print cartridge. Some suitable print cartridges can be disposable, while others can have a useful lifespan equal to or exceeding that of the printing device. Other exemplary configurations will be recognized by those of skill in the art.

As can more readily be seen in FIG. 4, print head 304 has multiple nozzles 402 through which fluid can be ejected. In some embodiments, firing nozzles ("nozzles") 402 may be arranged in one or more linear, generally linear, or staggered, nozzle array(s). By way of example, and as shown in FIG. 4, nozzles 402 are arranged in two generally linear and generally parallel nozzle arrays 404a–b which can be seen on an exposed surface 406 of print head 304. Other suitable examples can have more or fewer nozzle arrays on a print head suitably arranged for the intended application. For example, a print cartridge's print head may have a single nozzle array positioned thereon and another print cartridge may have three arrays arranged on a single printhead.

Figure 5:
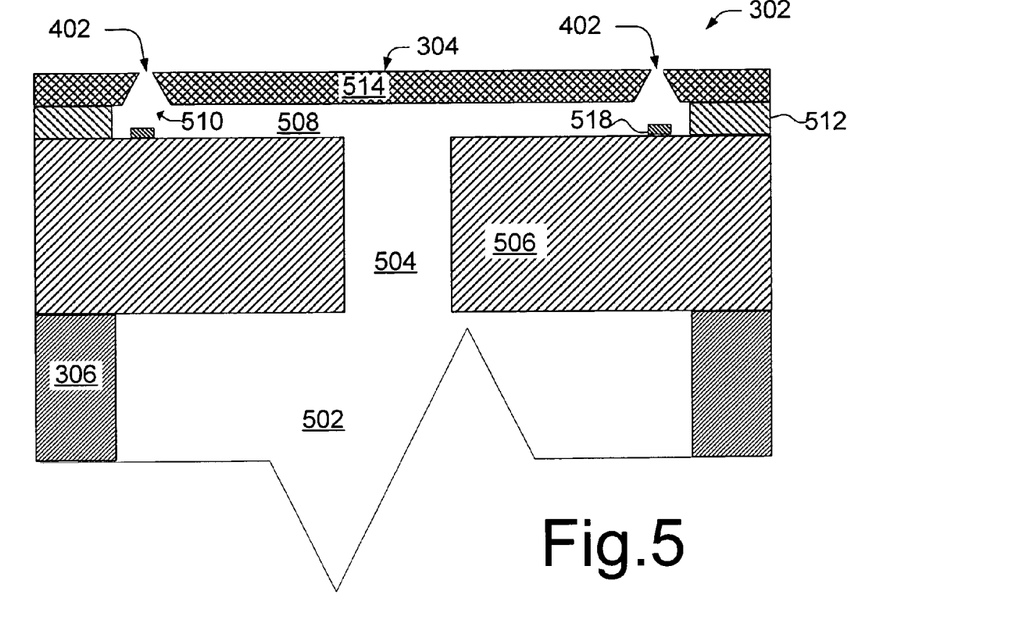
FIGS. 5–8 show cross-sectional views of a portion of exemplary print cartridges shown in accordance with one exemplary embodiment.

FIG. 5 shows a cross-sectional representation of a portion of exemplary print cartridge 302 as shown in FIG. 3. FIG. 5 shows cartridge body 306 connected to print head 304. Cartridge body 306 defines a fluid supply reservoir ("reservoir") 502. In some embodiments, cartridge body 306 may comprise a self contained reservoir. Alternatively or additionally, in other embodiments, the cartridge body may be coupled to an external fluid supply (not shown).

Print head 304 has a fluid feed slot ("slot") 504 formed or received in portions of substrate 506. Print head 304 also comprises fluid-feed passageway(s) "passageway" 508, and firing chamber(s) 510.

In some embodiments, firing chamber(s) 510 can be defined, at least in part, by a barrier layer 512. Positioned over the firing chambers 510 is an orifice layer 514 that has nozzles 402 formed therein. Each firing chamber 510 has an individually controllable energizing element 518 which can comprise thermal resistors or piezoelectric crystals, among others. In some exemplary embodiments, energizing elements 518 are part of a stack of thin film layers positioned over the substrate 506.

Substrate 506 can comprise various suitable materials. In some embodiments, substrate 506 comprises a crystalline substrate such as monocrystalline silicon. Examples of other suitable substrates include, among others, gallium arsenide, glass, silica, ceramics, or a semi-conducting material. The substrate can comprise various configurations as will be recognized by one of skill in the art.

Barrier layer 512 can comprise, among other things, a photo-imagable polymer substrate. In some embodiments, orifice layer 514 comprises a nickel, gold, palladium or other suitable metal substrate. In another embodiment, the orifice layer is a polymeric material as is the barrier layer. The various layers can be formed, deposited, or attached upon the preceding layers. The configurations given here are but a few of several possible configurations. For example, in an alternative embodiment, the orifice layer and barrier layer are integral.

Figure 6:
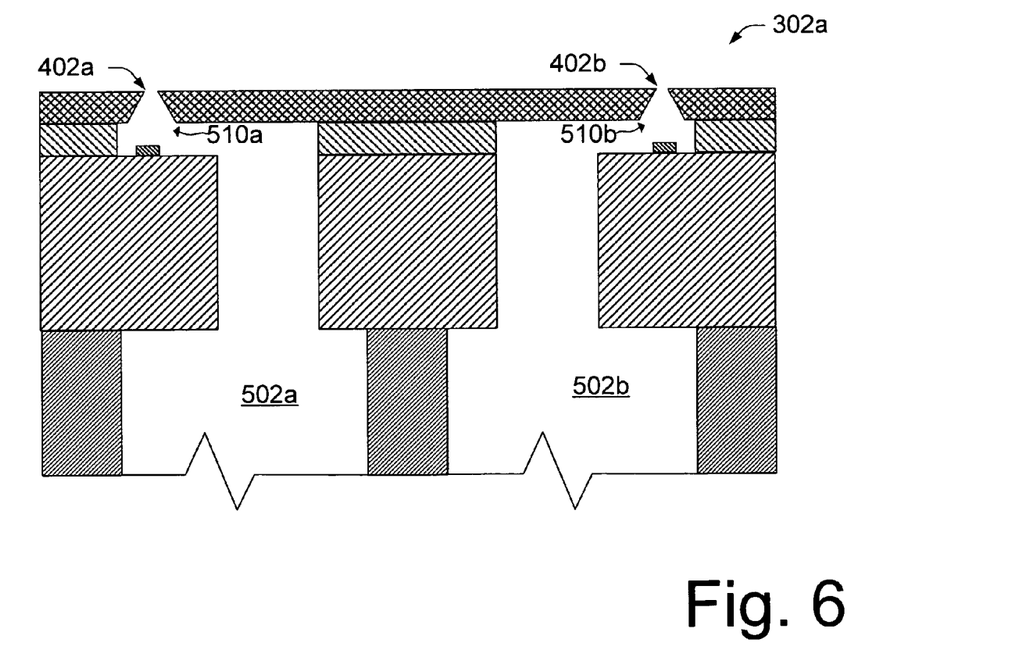

FIG. 6 shows a cross-sectional view of a print cartridge 302a that has two separate reservoirs 502a, 502b that can supply fluid to firing chambers 510a, 510b respectively. Fluid from reservoir 502a can be ejected from nozzle 402a while fluid from reservoir 502b can be ejected from nozzle 402b.

Figure 7:
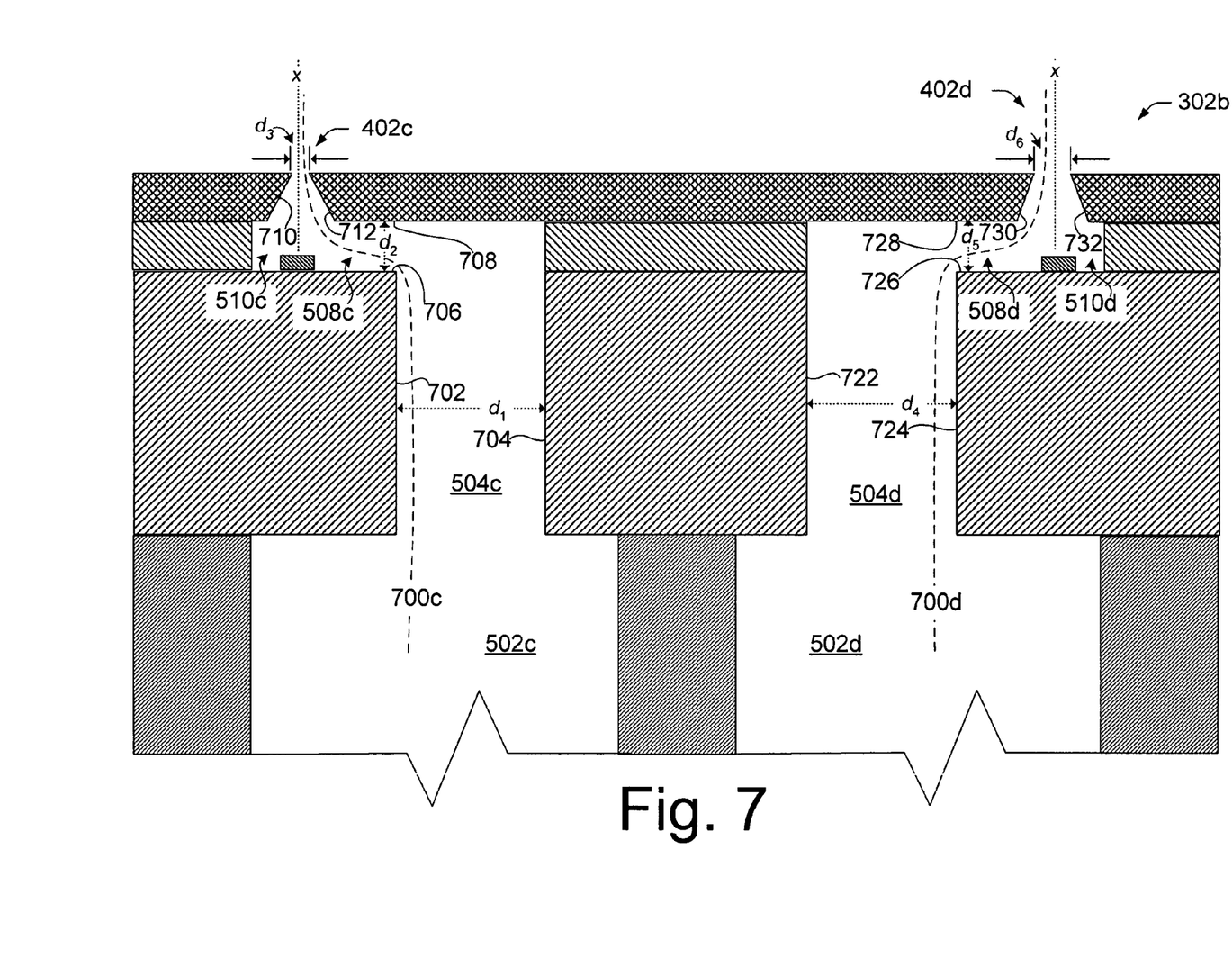

FIG. 7 shows a cross-sectional view of a portion of another print cartridge 302b. Print cartridge 302b has a first fluid supply path ("path") 700c supplied by reservoir 502c, and a second path 700d supplied by reservoir 502d. Dimensions of the respective paths can be defined, at least in part, by sidewalls of the print cartridge. In this embodiment, sidewalls 702–704, 706–708, and 710–712 define first path 700c. Sidewalls 722–724, 726–728, and 730–732 define second path 700d. Sidewalls 702–704 define a dimension $d_1$ therebetween. Similarly, sidewalls 706–708 and 710–712 define dimensions $d_2$ and $d_3$ respectively. Likewise, path 700d has sidewalls 722–724, 726–728, and 730–732 defining dimensions $d_4$, $d_5$, and $d_6$ respectively.

In this embodiment, dimensions $d_1$ and $d_2$ of path 700c are similar to $d_4$ $d_5$ respectively of path 700d. However, dimension $d_3$ which defines nozzle 402c is less than $d_6$ which defines nozzle 402d. In this embodiment, dimensions $d_3$, $d_6$ comprise a diameter of the respective nozzle taken transverse the nozzle's long axis x.

In these embodiments, diameter $d_3$ of nozzle 402c is less than about 25 microns while nozzle 402d has a diameter $d_6$ of greater than about 25 microns. In some embodiments, nozzle 402c is in a range of about 10 to about 25 microns, while nozzle 402d has a diameter in a range of about 25 to about 150 microns. In a further embodiment, nozzle 402c has a diameter of 12 to about 20 microns while nozzle 402d has a diameter of about 50 to about 100 microns. In one embodiment, the diameter of nozzle 402c is about 15 microns while nozzle 402d has a diameter of about 75 microns. The skilled artisan will recognize other suitable configurations.

In this embodiment, nozzles 402c, 402d have a generally conical shape along the long axis. Other suitable embodiments can have other shapes, such a cylindrical shape, when viewed along the nozzle's long axis.

In this embodiment the minimum dimensions of each of path 700c and 700d is the diameter of respective nozzles 402c, 402d. Other suitable configurations can have a minimum dimension in other areas such as $d_1$, $d_2$, $d_4$, or $d_5$ of a respective path.

Figure 8:
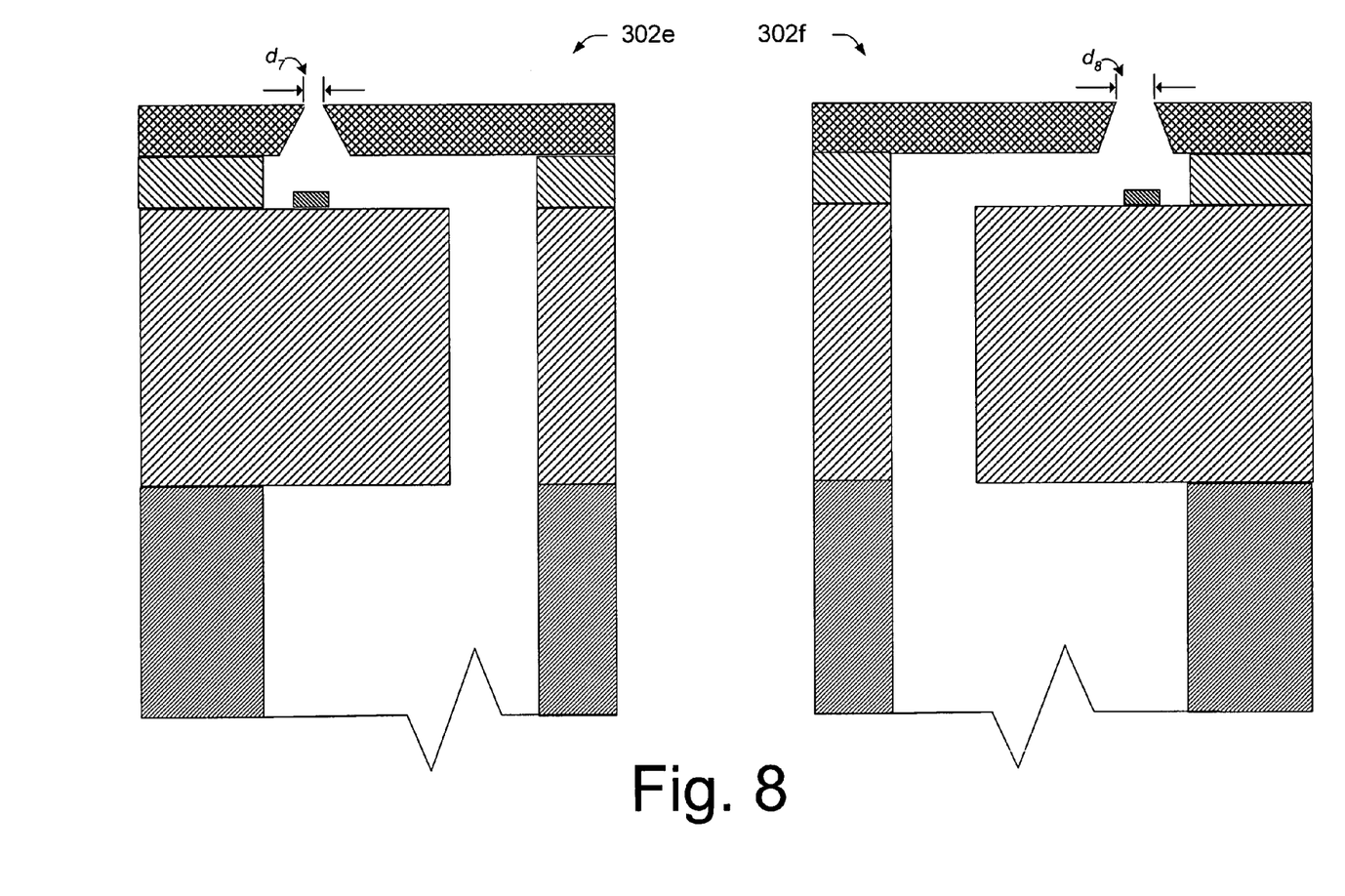

FIG. 8 shows cross-sections of portions of two additional print cartridges 302e, 302f. In this embodiment, print cartridge 302e has a nozzle diameter $d_7$ of about 12 microns, while print cartridge 302f has a nozzle diameter $d_8$ of about 30 microns.

In Operation

FIGS. 3–5 show print cartridge 302 capable of selectively ejecting drops of fluid from nozzle(s) 402. As best appreciated from FIG. 5, cartridge body 306 can contain a fluid supply reservoir 502 of a single fluid for ejection from print head 304. Print head 304 receives fluid from reservoir 502 via slot 504, which supplies one or more fluid-feed passageway(s) "passageway" 508. Individual passageways supply individual firing chambers 510.

Fluid supplied to a firing chamber 510 can be ejected through an orifice or nozzle 402. Ejected fluid is replaced by more fluid from the respective passageway 508. Ejection of fluid from an individual firing chamber 510 is accomplished with an individually controllable energizing element 518.

An energizing element 518 can be supplied with electrical energy via electrical traces, to cause a fluid drop to be ejected from the firing chamber 510. As will be recognized by the skilled artisan, such ink jet systems offer very uniform drops of a known volume. The placement of such drops on a media can be precisely controlled by the processor which causes the print cartridge and/or media to be positioned as desired. The combination of uniform drop size and precise placement allows ink jet printing devices to form precision patterns on the media. For example, many ink jet printing devices are able to achieve photo-grade images with the patterned drops.

FIG. 6 shows an embodiment for delivering two similar fluids such as commercially available red and blue ink. Print cartridge 302a, has two distinct and separate reservoirs 502a, 502b. This configuration can allow a different color ink to be ejected from nozzle 402a than from nozzle 402b. Similar print cartridges can be constructed with three or more separate reservoirs. While the print cartridges shown in FIGS. 3–6 can be utilized to eject different colors of ink, such print cartridges may be unsuitable for ejecting other types of fluids.

FIG. 7 shows a print cartridge 302b that is configured to deliver fluidic material of a first type such as commercially available ink and a second type fluidic material such as a solar slurry. Print cartridge 302b has a first path 700c and a second path 700d. First path 700c extends from reservoir 502c, through slot 504c, passageway 508c, firing chamber 510c, and nozzle 402c. Second path 700d extends from reservoir 502d, through slot 504d, passageway 508d, firing chamber 510d, and nozzle 402d.

In this embodiment, first path 700c has a minimum dimension comprising diameter $d_3$ of about 15 microns. Also in this embodiment, second path 700d has a minimum dimension comprising diameter $d_6$ of about 75 microns. As with the embodiments shown in FIGS. 3–6, the configuration of first path 700c can satisfactorily eject various inks comprising a first fluid type.

Second path 700d is configured to eject a second different fluid type. Such fluids can include fluidic material such as various slurried suspensions which have previously been impractical for use in ink jet printing devices. Slurried suspensions can comprise multi-phase mixed metal particles in a carrier solution, among other configurations. One such example is a solar slurry configured to exhibit photovoltaic properties when positioned on a media. A solar cell created in this fashion is intended to produce sufficient power to enable a low powered electronic application such as an Electro Luminescent (EL) lamp or audio device.

One specific example of a solar slurry comprises multi-phase mixed-metal particles comprising at least one metal oxide. The materials for this particular example can be inorganic, organic or a combination thereof suspended in a carrier solution. The slurry can be comprised from a wide range of particulated bulk material, including but not limited to the following Periodic Table families of elements: I–II-I–VI, II–VI, III–VI, III–V and II–IV–V, compounds and various alloys and dopants of these elements and elemental compounds. Suitable compounds for sub-micron particles for the slurry suspensions comprise a copper-indium-diselenide, $CuInSe_2$, alloy. Alloys with $CuInSe_2$ and gallium, (Ga), sulfur, (S), and additives such as sodium, (Na), among others, are also suitable.

Adding additional desirable constituents such as dopants and alloying elements such as gallium in copper-indium-diselenide may be achieved via additional slurry formulations supplied in additional print cartridge reservoirs and/or print cartridges. There are also additional desirable additives that can be added via various suspensions such as sodium to copper-indium-diselenide and its alloys.

In various suitable examples, the carrier solution can be aqueous, non-aqueous, and/or a combination of solvents both aqueous and non-aqueous. An example of a suitable solar slurry and related details can be found in U.S. Pat. No. 6,268,014.

FIG. 8 shows a further embodiment where print cartridge 302e is configured to eject a first fluid type such as ink, while print cartridge 302f is configured to eject a second fluid type comprising a solar slurry type suspension. An exemplary printing device can be configured to receive one or more of each of the two print cartridges 302e, 302f. Such a printing device can precisely deliver both fluidic inks and slurried suspensions, such as solar slurries.

The ability to precisely deliver slurried suspensions offers many new applications. In one such application, a solar cell can be created on a media by ejecting a solar slurry from the printing device in a desired pattern. The solar slurry can contact electrodes positioned on the media. The electrodes can also be connected to an electrical device that can be powered by the solar cell. This application can be utilized with traditional print media, such as PET (Mylar) slides/basefilm/substrate and coated paper such as 'Kraft®' paper, or with other less conventional media, given a user's substrate of choice that can be processed through an inkjet process. For example, an exemplary printing device can precisely form a solar cell of a desired size on a portion of a thin film circuit to provide a power supply to components of the circuit.

Other applications may combine the application of ink type fluids and slurried suspension type fluids to form a desired image. One such example can be seen in FIG. 9, which shows a greeting card 902. The greeting card includes media 904 comprising a desired substrate. Upon the media, an exemplary ink jet printing device has formed an image of three balloons 910a–c surrounded by a border 912. A string 914 hangs from the balloons and a greeting comprises text 916. In this application, balloons 910a–c appear red, green, and blue, respectively, to an observer. Text 916 and string 914 appear black, while border 912 appears dark grey.

Figure 9:
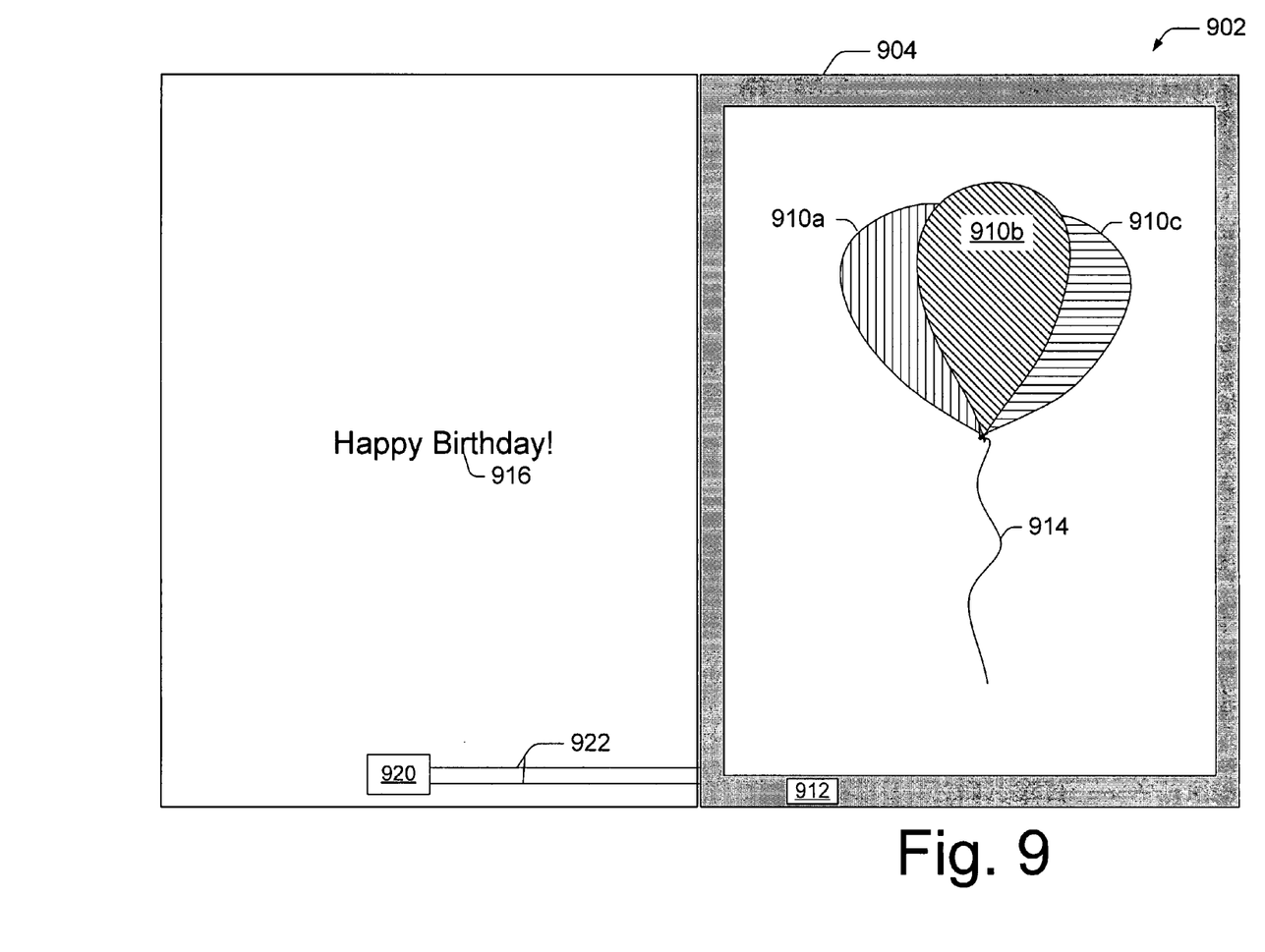
FIG. 9 shows an exemplary consumer device formed in accordance with one exemplary embodiment.

The card's appearance may be common and non-descript. Yet the appearance belies that part of the image is a solar cell. The solar cell supplies electrical energy to generate musical notes for an observer who opens the card. In this example, border 912 is formed from a solar slurry and powers an electronic device 920. The electronic device can comprise a chipset capable of reproducing musical notes, and is electrically coupled to solar cell 912 via electrical traces 922.

In this example, the red, blue, green, and black portions of the image comprise ink type fluids, and can be formed by multiple drops from an exemplary print cartridge or print cartridges such as 302e. The solar slurry can be formed by multiple drops from a print cartridge or print cartridges such as 302f.

The greeting card example described above is but one non-limiting example of a consumer good incorporating an exemplary solar cell. Alternatively or additionally packaging for a consumer good may also incorporate an exemplary solar cell. A consumer good as used herein is defined as any product offered for sale to a person, business, and/or governmental entity.

In some embodiments, an exemplary printing device configured to eject two fluid types can allow greeting cards to be designed on a computer. Corresponding print data can then be transferred via an interface to the printing device to print the card. Such a configuration can be valuable in various other applications, such as the thin film circuit application described above.

In further embodiments, various dyes and or pigments can be added to a solar slurry to generate different colored solar slurries. Several different colored solar slurries could be utilized to form a desired pattern in addition to, or in place of ink type fluids.

In some further embodiments, various conditioning agents may be applied to a print media to improve image quality and/or solar cell performance. Such conditioning agents can be applied before, during or after the image formation. Examples of conditioning agents can include fixers, among others.

Some exemplary print cartridges utilizing thermal resistors to eject the solar slurry can achieve relatively high temperatures in the firing chamber proximate the resistor. Such configurations may achieve increased solar cell performance due to aerosol pyrolosis among other factors.

CONCLUSION

The described embodiments can provide methods and systems for printing systems configured to eject a first fluid type and a second fluid type. In some embodiments, the second fluid type comprises a solar slurry that can form photo-voltaic cells on a print media. The solar slurry can be precisely delivered by the described print cartridges either alone or in conjunction with compatible inks. The ability to precisely pattern solar cells from slurried solar cell suspensions provides many previously unrealized opportunities.

Although the invention has been described in language specific to structural features and methodological steps, it is to be understood that the inventive concepts claimed below are not limited to the specific features or steps described. Rather, the specific features and steps are disclosed as forms of implementing the claimed invention.

What is claimed is:

1. A printing device comprising:
   one or more print cartridges configured to selectively eject generally fluidic material onto a media; and,
   wherein at least one print cartridge of the one or more print cartridges is configured to eject a first generally fluidic material comprising a slurried suspension, and wherein at least one print cartridge of the one or more print cartridges is configured to eject a second generally fluidic material that does not comprise a slurried suspension.

2. The printing device of claim 1, wherein the slurried suspension is configured to form a photovoltaic cell.

3. The printing device of claim 2, wherein multiple print cartridges are configured to eject the slurried suspension, and wherein at least one of the multiple print cartridges is configured to eject a form of the slurried suspension that appears as a first color to an observer, and at least one different print cartridge of the multiple print cartridges is configured to eject a different form of the slurried suspension that appears as a second different color to an observer.

4. The printing device of claim 2, wherein each of the one or more print cartridges is configured to eject the slurried suspension.

5. The printing device of claim 1, wherein the slurried suspension comprises multi-phase mixed metal particles in a carrier solution.

6. The printing device of claim 1 further comprising at least one print cartridge configured to eject a second generally fluidic material comprising solar cell conditioning agents.

7. A method comprising:
   configuring a printing device to receive a print media; and,
   configuring the printing device to receive one or more print cartridges configured to selectively eject multi-phase mixed metal particles in a carrier solution onto a print media, and one or more print cartridges configured to eject a fluidic ink that does not comprise multi-phase mixed metal particles.

8. A printing device comprising:
   one or more print cartridges configured to selectively eject generally fluidic material onto a media; and,
   wherein at least one print cartridge of the one or more print cartridges is configured to eject a first generally fluidic material comprising a slurried suspension; and,
   at least one print cartridge configured to eject a second generally fluidic material comprising solar cell conditioning agents.

9. The printing device of claim 8, wherein the slurried suspension is configured to form a photovoltaic cell.

10. The printing device of claim 9, wherein multiple print cartridges are configured to eject the slurried suspension, and wherein at least one of the multiple print cartridges is configured to eject a form of the slurried suspension that appears as a first color to an observer, and at least one different print cartridge of the multiple print cartridges is configured to eject a different form of the slurried suspension that appears as a second different color to an observer.

11. The printing device of claim 9, wherein each of the one or more print cartridges is configured to eject the slurried suspension.

12. The printing device of claim 8, wherein the slurried suspension comprises multi-phase mixed metal particles in a carrier solution.

13. The printing device of claim 8 further comprising at least one print cartridge configured to eject a second generally fluidic material that does not comprise a slurried suspension.

* * * * *